United States Patent [19]

Kousaka et al.

[11] Patent Number: 4,835,417
[45] Date of Patent: May 30, 1989

[54] COMPARATOR CIRCUIT HAVING IMPROVED OUTPUT CHARACTERISTICS

[75] Inventors: Kunimitsu Kousaka, Kawasaki; Kunihiko Gotoh, Kunitachi; Osamu Kobayashi, Yokohama, all of Japan

[73] Assignee: Fujitsu Limited, Kawasaki, Japan

[21] Appl. No.: 134,581

[22] Filed: Dec. 10, 1987

Related U.S. Application Data

[63] Continuation of Ser. No. 836,063, Mar. 4, 1986, abandoned.

[30] Foreign Application Priority Data

Mar. 6, 1985 [JP] Japan ................................. 60-42706
Mar. 6, 1985 [JP] Japan ................................. 60-42707

[51] Int. Cl.$^4$ ........................ H03K 5/24; H03K 17/04
[52] U.S. Cl. ................................. 307/362; 307/494; 307/548; 307/549
[58] Field of Search ............... 307/355, 362, 494, 540, 307/546, 547, 548, 549, 550, 554, 555, 568, 591

[56] References Cited

U.S. PATENT DOCUMENTS

| | | | |
|---|---|---|---|
| 3,780,317 | 12/1973 | Kurata et al. ........................ | 307/355 |
| 3,970,951 | 7/1976 | Hoffman ............................. | 307/362 |
| 4,103,249 | 7/1978 | Burdick . | |
| 4,118,640 | 10/1978 | Ochi et al. . | |
| 4,394,587 | 7/1983 | McKenzie et al. ................... | 307/355 |
| 4,438,349 | 3/1984 | Shoji .................................... | 307/362 |
| 4,527,076 | 7/1985 | Matsuo et al. ....................... | 307/362 |
| 4,529,891 | 7/1985 | Oida .................................... | 307/355 |

FOREIGN PATENT DOCUMENTS 0146910 7/1985 European Pat. Off. .
3215661 12/1982 Fed. Rep. of Germany .

OTHER PUBLICATIONS

Patents Abstracts of Japan, vol. 9, No. 53 (E-301) [1776], Mar. 7, 1985; & JP-A-59 191 936 (Nippon Denki K.K.) 10-31-84.
Patents Abstracts of Japan, vol. 5, No. 63 (E-54) [735], Apr. 28, 1981; & JP-A-56 14 726 (Matsushita Kenki Sangyo K.K.) 02-13-81.
IEEE Journal of Solid State Circuits, vol. SC-13, No. 6, Dec. 1978, pp. 760-766, Senderowica et al.: "High-performance NMOS operational amplifier".

Primary Examiner—John Zazworsky
Attorney, Agent, or Firm—Staas & Halsey

[57] ABSTRACT

In a comparator circuit comprising a first power supply terminal means and a second power supply terminal means, a differential stage connected between the first power supply terminal means and the second power supply terminal means, a first input signal having a reference level and a second input signal having a level which is compared with the reference level being input to each of a pair of input terminals of the differential stage, respectively, an output signal having a level which is determined in accordance with the level of the second input signal being output from an output terminal of the differential stage, and an output stage connected to the output terminal of the differential stage, through which output stage the output signal of the differential stage is amplified; a bypass circuit through which a predetermined constant current flows is connected between the output terminal of the differential stage and the second power supply terminal means.

The bypass circuit may be always closed or may be closed only when the output level of the output stage has reached the predetermined value.

5 Claims, 7 Drawing Sheets

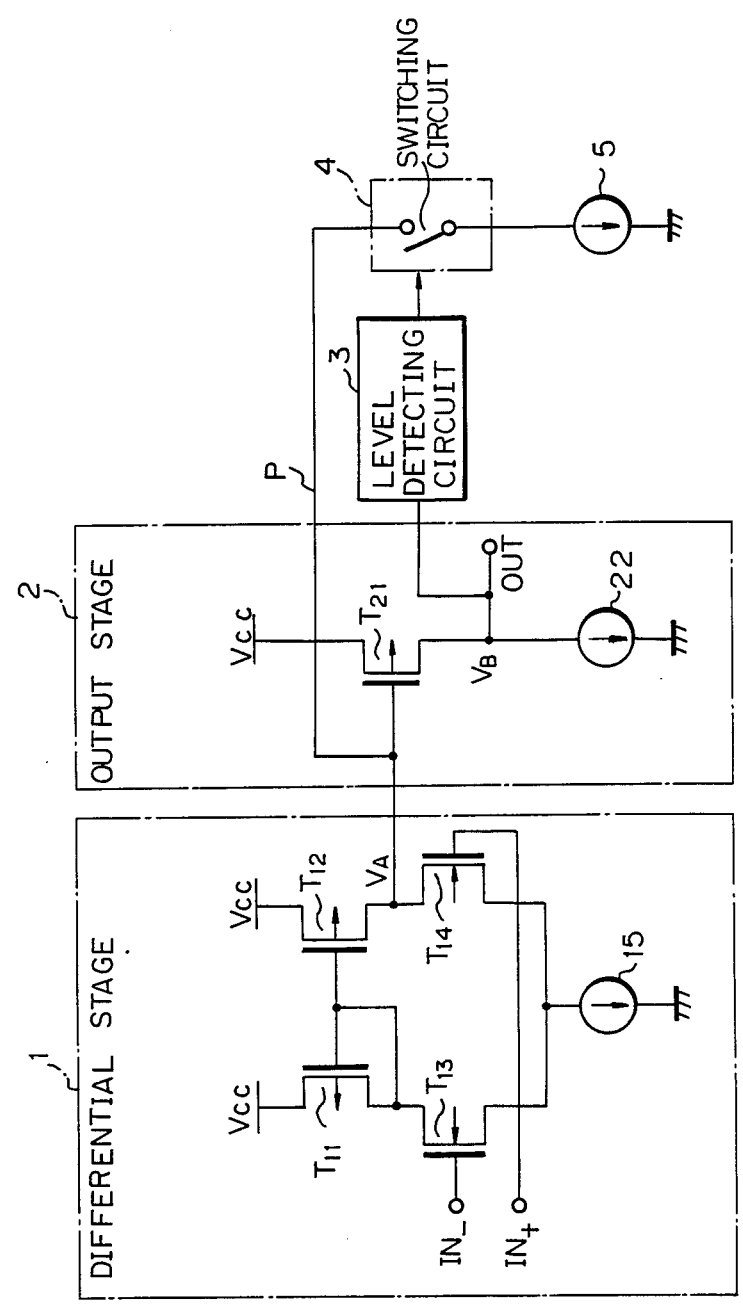

COMPARATOR CIRCUIT HAVING IMPROVED OUTPUT CHARACTERISTICS

This is a continuation of co-pending application Ser. No. 836,063, filed on Mar. 4, 1986, abandoned.

BACKGROUND OF THE INVENTION

1. Field of the Invention

The present invention relates to a comparator circuit. More particularly, it relates to a comparator circuit comprising a differential stage and an output stage, which circuit is usually constructed by a semiconductor integrated circuit.

2. Description of the Related Art

Generally, in a comparator circuit comprising a differential stage and an output stage, a first input signal having a reference level and a second input signal having a level to be compared with the reference level are input to each of a pair of terminals, and an output signal having a level which is determined in accordance with the level of the second input signal is output from an output terminal. Also, the output signal of the differential stage is supplied to the output stage, through which the output signal of the differential stage is inverted and amplified.

In such a prior art comparator circuit, if it is assumed that the level of the second input signal becomes higher than the level of the first input signal and the voltage level difference between these two input signals increases, a transistor provided in the differential stage and having a gate to which the first input signal is supplied approaches a cut-off state. Thus, the output voltage level of the differential stage gradually rises, and finally, a transistor (P channel type) provided in the output stage and having a gate to which the output signal of the differential stage is supplied is brought to the cut-off state.

After such a cut-off state of the above transistors has occurred, if the level of the second input signal falls and becomes lower than the level of the first input signal, it is necessary to turn on the above transistors in the cut-off state. However, as a stray capacity usually exists in the semiconductor device, a long time is needed to turn on the above transistors due to the time for charging the stray capacity. Therefore, a problem arises in that the operational speed of the comparator circuit is remarkably delayed, especially when the level of the second input signal falls from high level to low level.

SUMMARY OF THE INVENTION

The present invention has been completed in order to solve the above-mentioned problems, and the object of the present invention is to prevent the delay of the operational speed of the comparator circuit by limiting the range of the voltage level output from the differential stage.

To attain this object, according to the present invention, there is provided a comparator circuit comprising a first power supply terminal means and a second power supply terminal means; a differential stage connected between the first power supply terminal means and the second power supply terminal means, a first input signal having a reference level and a second input signal having a level to be compared with the reference level being input to each of a pair of input terminals of the differential stage, respectively, an output signal having a level which is determined in accordance with the level of the second input signal being output from an output terminal of the differential stage; an output stage connected to the output terminal of the differential stage, through which output stage the output signal of the differential stage is amplified; and a bypass circuit connected between the output terminal of the differential stage and the second power supply terminal means.

According to one embodiment of the present invention, a predetermined constant current always flows through the bypass circuit, and thus, the increase of the voltage level output from the differential stage is limited.

According to another embodiment of the present invention, a predetermined constant current flows through the bypass circuit only when the output voltage level of the output stage becomes equal to or lower than the predetermined level (namely, when the output voltage level of the differential stage increases to the level which is equal to or higher than the predetermined value), and thus, the increase of the voltage level output from the differential stage is limited.

Thus, according to the present invention, it is possible to prevent the transistors provided in the differential stage and the output stage from reaching the complete cut-off state and to perform the predetermined operation of the comparator circuit at a high speed in accordance with the inversion of the above second input signal level.

BRIEF DESCRIPTION OF THE DRAWINGS

FIG. 5 is a circuit diagram illustrating another embodiment of the comparator circuit according to the present invention;

DESCRIPTION OF THE PREFERRED EMBODIMENTS

Figure 1:
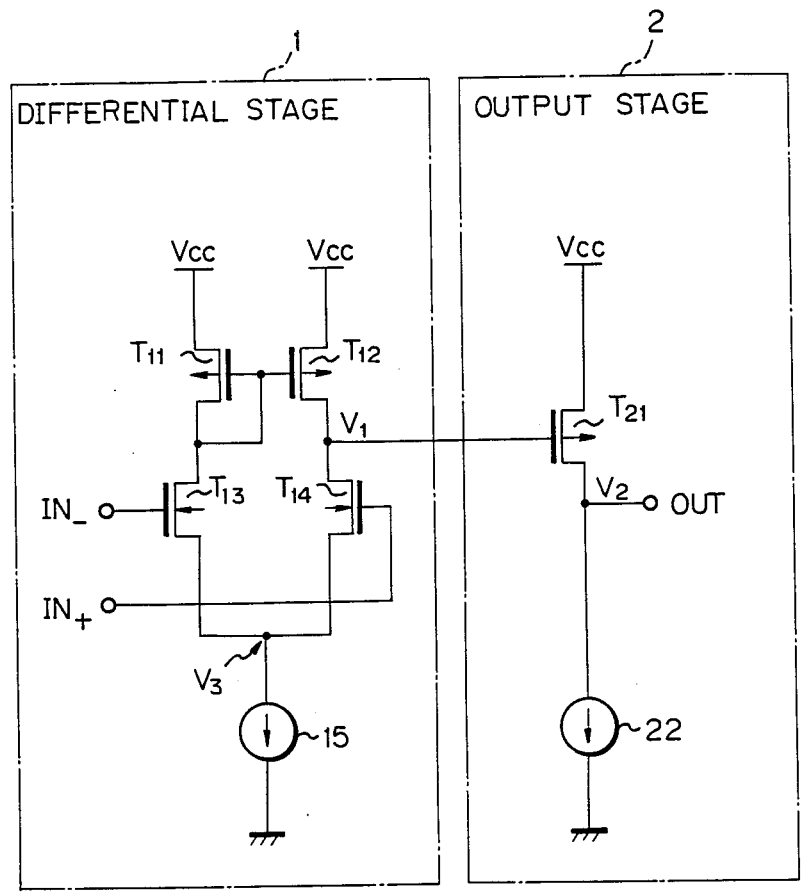
FIG. 1 is a circuit diagram illustrating an example of a prior art comparator circuit.

In order to clarify the background of the present invention, an example of a prior art comparator circuit having a differential stage and an output stage is shown in FIG. 1.

In FIG. 1, reference numeral 1 corresponds to the differential stage and reference numeral 2 corresponds to the output stage, both the differential stage 1 and the output stage 2 are connected between the predetermined positive potential $V_{CC}$ and the earth potential. As shown in FIG. 1, the differential stage 1 comprises P channel type transistors $T_{11}$ and $T_{12}$, N channel type transistors $T_{13}$ and $T_{14}$ having sources connected in common, and a constant current source 15 connected between the sources of the transistors $T_{13}$ and $T_{14}$ and the earth potential. An input signal (IN+) having a reference voltage level is input to a gate of the transistor $T_{14}$, and another input signal (IN−) having a voltage level to be compared with the reference level of the input signal (IN+) is input to a gate of the transistor $T_{13}$.

The voltage level $V_1$ of the connection point between each drain of the transistors $T_{12}$ and $T_{14}$ is supplied to a gate of a P channel type transistor $T_{21}$ provided in the output stage 2. The output stage 2 comprises the above transistor $T_{21}$ and a constant current source 22 connected between a drain of the transistor $T_{21}$ and the earth potential. The voltage level $V_2$ of the drain of the transistor $T_{21}$ is output from the output stage 2 as an output signal OUT of the comparator circuit.

In such a comparator circuit, even when the voltage level difference between the above-mentioned input signals (IN−) and (IN+) is small, the ratio of the current flowing through the transistor $T_{13}$ to the current flowing through the transistor $T_{14}$ is determined in accordance with the voltage level difference between the input signals (IN−) and (IN+), and as a result, the voltage level $V_1$ obtained from the drain of the transistor $T_{14}$, namely, the output side of the differential stage 1, is amplified in accordance with the change in the above voltage level difference.

In this connection, when it is assumed that the level of the input signal (IN−) has become higher than the level of the reference input signal (IN+), the source level of the N channel transistor $T_{13}$ rises in accordance with the supply of the input signal (IN−). Then, the source level of the transistor $T_{14}$ also rises equally, and thus, more current flows through the transistor $T_{13}$ than through the transistor $T_{14}$. As a result, the voltage level of gates of the P channel transistors $T_{11}$ and $T_{12}$ connected to the drain of the transistor $T_{13}$ falls, and thereby, it is intended to increase the current flowing through the transistor $T_{12}$. However, the N channel transistor $T_{14}$ to which the reference input signal (IN+) is supplied tends to decrease the current, and as a result, the voltage level $V_1$ of the drain of the transistor $T_{14}$ rises in accordance with the voltage level difference between the above input signals (IN−) and (IN+).

Contrary to this, if the level of the input signal (IN−) has become lower than the level of the reference input signal (IN+), the source level of the N channel transistor $T_{13}$ falls in accordance with the supply of the input signal (IN−). Then, the source level of the transistor $T_{14}$ also falls equally, and thus, more current flows through the transistor $T_{14}$ than through the transistor $T_{13}$. As a result, the voltage level of the gates of the P channel transistors $T_{11}$ and $T_{12}$ rises, and thereby, it is intended to decrease the current flowing through the transistor $T_{12}$. However, the N channel transistor $T_{14}$ to which the reference input signal (IN+) is supplied tends to increase the current, and as a result, the voltage level $V_1$ of the drain of the transistor $T_{14}$ falls in accordance with the voltage level difference between the above input signals (IN−) and (IN+).

Next, the voltage level $V_1$ which is amplified as above-mentioned, in accordance with the change in the above voltage level difference is output from the differential stage 1 and is supplied to the gate of the P channel transistor $T_{21}$ provided in the output stage 2. Thus, in the output stage 2, the above voltage level $V_1$ is inverted and further amplified, and finally, the voltage level $V_2$ of the drain of the transistor $T_{21}$ is output from the output stage 2 as the output signal OUT of the comparator circuit.

In such a prior art comparator circuit, if it is assumed that the level of the input signal (IN−) gradually rises and the voltage level difference between the input signals (IN−) and (IN+) increases, the source level $V_3$ of the transistors $T_{13}$ and $T_{14}$ gradually rises, and thus, the N channel transistor $T_{14}$ is brought to the cut-off state. As a result, the voltage level $V_1$ of the drain of the transistor $T_{14}$ reaches $V_{CC}$, and thus, the P channel transistor $T_{21}$ having the gate to which the above voltage level $V_{CC}$ is supplied is also brought to the cut-off state.

After such a cut-off state of the transistors $T_{14}$ and $T_{21}$ has occurred, if the level of the input signal (IN−) falls and becomes lower than the level of the input signal (IN+), it is necessary to turn on both transistors $T_{14}$ and $T_{21}$. However, at that time, if the transistors $T_{14}$ and $T_{21}$ are in the complete cut-off state as in the above prior art, a long time is needed to turn on the transistors $T_{14}$ and $T_{21}$ due to the time required for charging the stray capacity, and as a result, a problem arises in that the operational speed of the comparator circuit is remarkably delayed, especially when the level of the input signal (IN−) falls from high level to low level, as above-mentioned.

Figure 2:
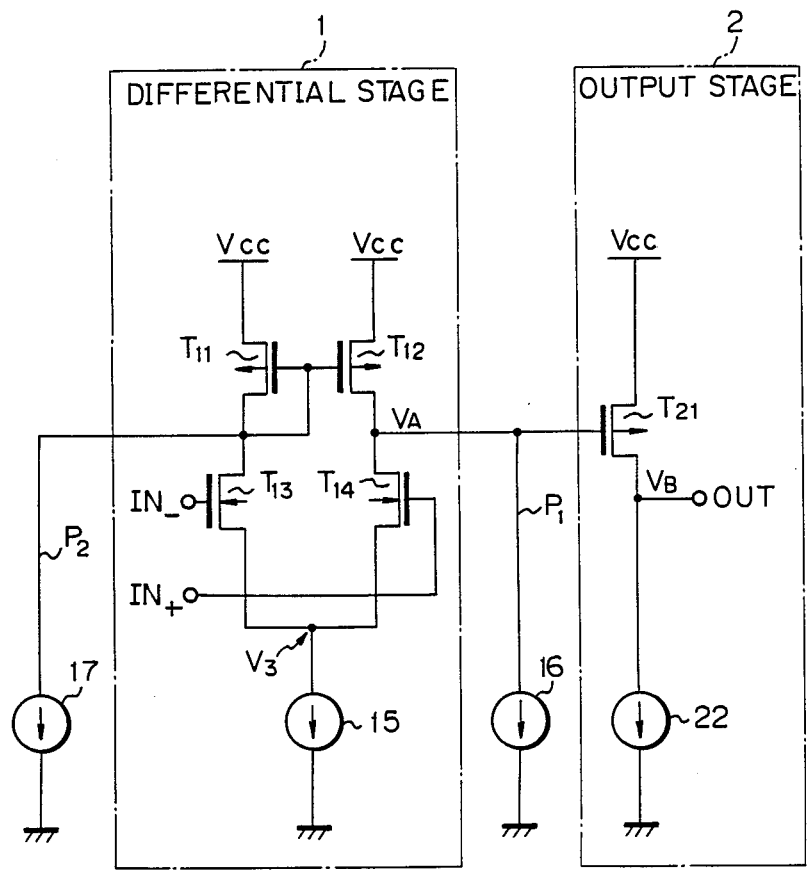
FIG. 2 is a circuit diagram illustrating one embodiment of the comparator circuit according to the present invention.

The present invention has been attained in order to solve such a problem, and FIG. 2 shows a circuit diagram illustrating one embodiment of the comparator circuit according to the present invention. In FIG. 2, members identical to those of FIG. 1 are represented by the same reference numerals or characters (as in all later figures).

As shown in FIG. 2, the comparator circuit according to one embodiment of the present invention, comprises a bypass circuit $P_1$ for the transistor $T_{14}$ connected between the output side of the differential stage 1 (namely, the connection point between each drain of the transistors $T_{12}$ and $T_{14}$) and the earth potential. The bypass circuit $P_1$ comprises a constant current source 16, so that a predetermined constant current always flows through the bypass circuit $P_1$.

The comparator circuit shown in FIG. 2, also comprises a bypass circuit $P_2$ for the transistor $T_{13}$ connected between the drain of the transistor $T_{13}$ and the earth potential. The bypass circuit $P_2$ comprises a constant current source 17, so that a predetermined constant current flows through the bypass circuit $P_2$. Thus, it is possible to balance the current flowing through the circuit including the transistors $T_{11}$ and $T_{13}$ with the current flowing through the circuit including the transistors $T_{12}$ and $T_{14}$, by providing the above bypass circuits $P_1$ and $P_2$.

Figure 3A:
FIGS. 3(a)–3(c) are timing diagrams illustrating each operation of the comparator circuits shown in FIG. 1 and in FIG. 2.
Figure 3B:
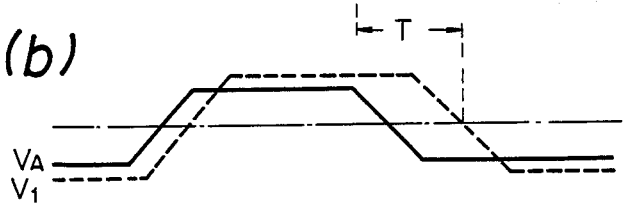
Figure 3C:

FIGS. 3(a)-3(c) are timing diagrams showing each operation of the comparator circuits shown in FIG. 1 and in FIG. 2, in order to be able to compare the operation of the circuit shown in FIG. 2 with that of the circuit shown in FIG. 1.

The variation state of the level of the input signal (IN−) from the reference level of the input signal (IN+) is shown in FIG. 3(a).

Also, the variation state of the output voltage level $V_1$ (or $V_A$) of the differential stage 1 is shown in FIG. 3(b), and the variation state of the output voltage level $V_2$ (or $V_B$) of the output stage 2 is shown in FIG. 3(c). In FIG. 3(b) and FIG. 3(c), the dotted line corresponds to the operation of the prior art comparator circuit shown in FIG. 1, and the solid line corresponds to the operation of the comparator circuit according to the present invention shown in FIG. 2.

In the prior art comparator circuit as shown in FIG. 1, when the level of the input signal (IN−) becomes higher than the level of the reference input signal (IN+), the output voltage level $V_1$ of the differential stage 1 rises. As a result, the transistor $T_{21}$ and the transistor $T_{14}$ are brought to the complete cut-off state, especially when the level difference between the input signals (IN−) and (IN+) becomes large. Therefore, after that time, when the level of the input signal (IN−) becomes lower than the level of the input signal (IN+) as shown in FIG. 3(a), a long time is needed to turn on the above transistors $T_{14}$ and $T_{21}$ from the complete cut-off state. Namely, a remarkable time delay T is expended to invert the output voltage level $V_1$ from high level to low level in accordance with the level of the input signal (IN−) inverted from high level to low level, as shown by the dotted line in FIG. 3(b). Such a time delay is also expended to invert the output voltage level $V_2$ from low level to high level, as shown by the dotted line in FIG. 3(c).

Contrary to this, in the comparator circuit according to the present invention as shown in FIG. 2, when the level of the signal (IN−) is higher than the level of the reference signal (IN+), the output voltage level $V_A$ of the differential stage 1 obtained from the drain of the transistor $T_{14}$ rises, and thus, the output voltage level $V_B$ of the output stage 2 obtained from the drain of the transistor $T_{21}$ falls.

At that time, the transistor $T_{14}$ gradually approaches the cut-off state in accordance with the level difference between the input signals (IN−) and (IN+). However, as above-mentioned, the constant current source 16 is connected between the drain of the transistor $T_{14}$ and the earth potential to form the bypass circuit $P_1$ for the transistor $T_{14}$, and thus, a predetermined constant current always flows through the bypass circuit $P_1$ and the transistor $T_{12}$.

As a result, the voltage level $V_A$ of the drain of the transistor $T_{14}$ does not rise more than the predetermined value, and the transistor $T_{21}$ cannot be brought to the cut-off state, even if the transistor $T_{14}$ approaches the cut-off state.

Therefore, after that time, when the level of the signal (IN−) becomes lower than the level of the reference signal (IN+), it is possible to rapidly invert the output level $V_A$ of the differential stage 1, and further, the output level $V_B$ of the output stage 2, in accordance with the inversion of the level of the input signal (IN−) from high level to low level, as shown by the solid line in FIG. 3(b) and FIG. 3(c).

Further, as the comparator circuit shown in FIG. 2 comprises the constant current sources $P_1$ and $P_2$, the current flowing through the circuit including the transistors $T_{11}$ and $T_{13}$ is in balance with the current flowing through the circuit including the transistors $T_{12}$ and $T_{14}$, and the configuration of the circuit to which the signal (IN−) is input becomes the same as the circuit to which the signal (IN+) is input.

Thus, in the comparator circuit shown in FIG. 2, it is possible to operate the circuit in the active condition, and therefore, it is possible to rapidly invert the output levels $V_A$ and $V_B$ in accordance with the inversion of the level of the signal (IN−) to be compared with the reference level of the signal (IN+) and to perform the predetermined operation at a high speed.

Figure 4:
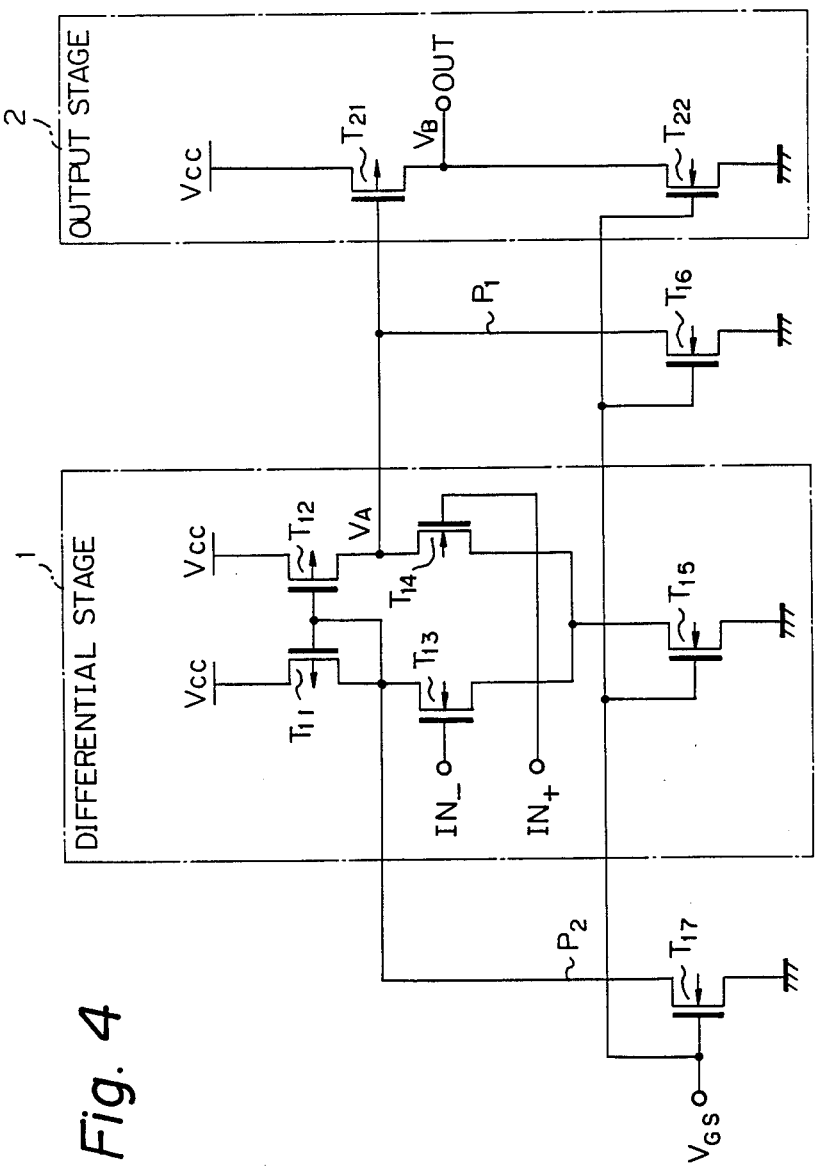
FIG. 4 is a circuit diagram of the comparator circuit shown in FIG. 2, in which circuit diagram an example of the concrete construction of constant current sources shown in FIG. 2 are also illustrated.

FIG. 4 shows an example of a concrete construction of the constant current sources 15, 16, 17, and 22. As shown in FIG. 4, these constant current sources 15, 16, 17, and 22 comprise each of the transistors $T_{15}$, $T_{16}$, $T_{17}$, and $T_{22}$, respectively, and a predetermined bias voltage $V_{GS}$, the value of which is about 1 to 2 volts when the power supply voltage $V_{CC}$ is 10 volts, is supplied to each gate of the transistors $T_{15}$, $T_{16}$, $T_{17}$, and $T_{22}$.

FIG. 5 shows a circuit diagram illustrating another embodiment of the comparator circuit according to the present invention.

As shown in FIG. 5, the comparator circuit according to another embodiment of the present invention comprises a level detecting circuit 3 and a bypass circuit P which is provided with a switching circuit 4 and a constant current source 5. The detecting circuit 3 detects the output voltage level $V_B$ of the output stage 2, and generates a predetermined output signal in order to close the switching circuit 4 when the voltage level $V_B$ becomes equal to or less than the predetermined value in accordance with the rising of the output voltage level $V_A$ of the differential stage 1. Thus, when the switching circuit 4 is closed by the output signal of the detecting circuit 3, the bypass circuit P for the transistor $T_{14}$ is connected between the output side of the differential stage 1 (namely, the connection point between each drain of the transistors $T_{12}$ and $T_{14}$) and the earth potential. As the bypass circuit P comprises a constant current source 5, a predetermined constant current flows when the switching circuit 4 is closed.

Figure 6A:
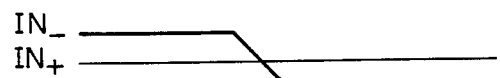
FIGS. 6(a)–6(c) are timing diagrams illustrating each operation of the comparator circuit shown in FIG. 1 and in FIG. 5.
Figure 6B:
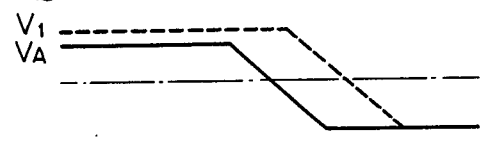
Figure 6C:
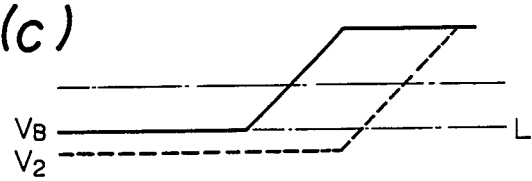

FIGS. 6(a)–6(c) are timing diagrams showing each operation of the comparator circuits shown in FIG. 1 and FIG. 5, in order to be able to compare the operation of the circuit shown in FIG. 5 with that of the circuit shown in FIG. 1.

The variation state of the level of the input signal (IN−) from the reference level of the input signal (IN+) is shown in FIG. 6(a).

Also, the variation state of the output voltage level $V_1$ (or $V_A$) of the differential stage 1 is shown in FIG. 6(b), and the variation state of the output voltage level $V_2$ (or $V_B$) of the output stage 2 is shown in FIG. 6(c). In FIG. 6(b) and FIG. 6(c), the dotted line corresponds to the operation of the prior art comparator circuit shown in FIG. 1, and the solid line corresponds to the operation of the comparator circuit according to the present invention shown in FIG. 5.

As above-mentioned, in the prior art circuit shown in FIG. 1, a remarkable time delay is expended to invert the voltage level $V_1$ from high level to low level and the voltage level $V_2$ from low level to high level in accordance with the input signal (IN−) inverted from high level to low level, as shown by the dotted line in FIG. 6(b) and FIG. 6(c).

Contrary to this, in the comparator circuit according to the present invention as shown in FIG. 5, when the level of the signal (IN−) is higher than the level of the reference signal (IN+), the output voltage level $V_A$ of the differential stage 1 rises, and therefore, the output voltage level $V_B$ of the output stage 2 falls. However, if the voltage level $V_B$ becomes equal to or lower than the predetermined level L as shown in FIG. 6(c) in accordance with the level difference between the input signals (IN−) and (IN+), the detecting circuit 3 detects the lowering of the voltage level $V_B$ and supplies the predetermined signal to the switching circuit 4. Then, the switching circuit 4 is closed by the signal supplied from the detecting circuit 3, and as a result, the constant current source 5 is connected between the drain of the transistor $T_{14}$ and the earth potential to form the bypass circuit P for the transistor $T_{14}$, and thereby, a predetermined constant current flows through the bypass circuit P and the transistor $T_{12}$.

As a result, the voltage level $V_B$ does not fall to the value lower than the predetermined level L, namely, the voltage level $V_A$ does not rise higher than the predetermined value, and thus, P channel transistor $T_{21}$ cannot be brought to the cut-off state, and it is possible to operate the circuit in the active condition.

Therefore, after that time, when the level of the signal (IN−) becomes lower than the level of the reference signal (IN+), it is possible to rapidly invert the output level $V_A$ of the differential stage 1 and further, the output level $V_B$ of the output stage 2, and to perform the predetermined inverting operation at a high speed.

Figure 7:
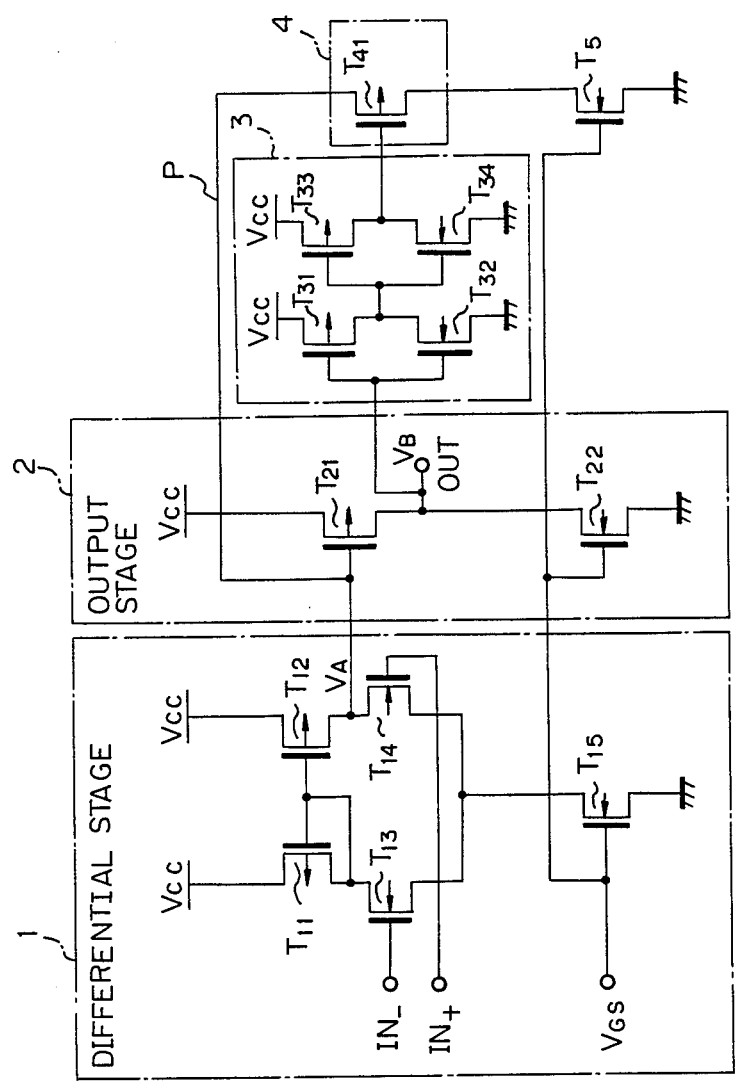
FIG. 7 is a circuit diagram of the comparator circuit shown in FIG. 5, in which circuit diagram an example of the concrete construction of constant current sources shown in FIG. 5 are also illustrated.

FIG. 7 shows an example of a concrete construction of the level detecting circuit 3 and the switching circuit 4 shown in FIG. 5. The detecting circuit 3 comprises a first stage inverter comprising a pair of transistors $T_{31}$ and $T_{32}$ and a second stage inverter comprising a pair of transistors $T_{33}$ and $T_{34}$. Also, the switching circuit 4 comprises a P channel type transistor $T_{41}$.

The output voltage (having the level $V_B$) of the output stage 2 is supplied to each gate of the above transistors $T_{31}$ and $T_{32}$, and when the voltage level $V_B$ has fallen to the predetermined level L (the value of which level L is set to $(1/5) \times V_{CC}$, for example, where $V_{CC}$ is the power supply voltage), the voltage level $V_B$ is inverted by the first stage inverter comprising a pair of transistors $T_{31}$ and $T_{32}$ (namely, the output level of the first stage inverter becomes high level), and further, the output level of the first stage inverter is inverted by the second stage inverter comprising a pair of transistors $T_{33}$ and $T_{34}$ (namely, the output level of the second stage inverter becomes low level). Then, the output voltage of the second stage inverter (having a low level) is supplied to a gate of the P channel transistor $T_{41}$. Thus, the transistor $T_{41}$ turns on, and as a result, the bypass circuit P comprising a constant current source is connected between the output side of the differential stage 1 and the earth potential.

As shown in FIG. 7, he constant current sources 15, 22, and 5 shown in FIG. 5, comprise each of the transistors $T_{15}$, $T_{22}$, and $T_5$, respectively, and a predetermined bias voltage $V_{GS}$, the value of which is about 1 to 2 volts when the power supply voltage $V_{CC}$ is 10 volts, is supplied to each gate of the transistors $T_{15}$, $T_{22}$, and $T_5$.

As described above, according to the present invention, it is possible to limit the range of the output voltage level of the differential stage, and to perform the predetermined operation of the comparator circuit at a high speed in accordance with the inversion of the input signal level.

We claim:

1. A comparator circuit comprising:
a first power supply terminal and a second power supply terminal;
a differential stage connected between said first power supply terminal and said second power supply terminal, a first input signal having a reference level and a second input signal having a level to be compared with said reference level being input to each of a pair of input terminals of said differential stage, respectively, an output signal having a level which is determined in accordance with the level of said second input signal being output from an output terminal of said differential stage, said differential stage comprising:
a first transistor and a second transistor having sources connected in common, said pair of input terminals being connected to each of gates of said first and second transistors, respectively;
a third transistor having a source connected to said first power supply terminal and having a gate and a drain both connected to a drain of said first transistor;
a fourth transistor having a source and a drain each of which is connected to each of said first power supply terminal and a drain of said second transistor and having a gate connected to said gate of said third transistor, a connection point between each drain of said second and fourth transistors being used as said output terminal, and
a constant current source connected between said sources of said first and second transistors and said second power supply terminal;
an output stage connected to said output terminal of said differential stage for amplifying the output signal of said differential stage, comprising:
a transistor element to which said output signal of said differential stage is supplied; and
a constant current source coupled to said transistor element and said second power supply terminal;
a first bypass circuit connected between said output terminal of said differential stage and said second power supply terminal; and
a second bypass circuit connected between said drain of said first transistor and said second power supply terminal.

2. A comparator circuit according to claim 1, wherein said second bypass circuit comprises a constant current source, a predetermined constant current always flowing through said second bypass circuit.

3. A comparator circuit comprising:
a first power supply terminal and a second power supply terminal;
a differential stage connected between said first power supply terminal and said second power supply terminal, a first input signal having a reference level and a second input signal having a level to be compared with said reference level being input to each of a pair of input terminals of said differential stage, respectively, an output signal having a level which is determined in accordance with the level of said second input signal being output from an output terminal of said differential stage;
an output stage connected to said output terminal of said differential stage for amplifying the output signal of said differential stage, comprising:
a transistor element to which said output signal of said differential stage is supplied; and
a constant current source coupled to said transistor element and said second power supply terminal;
a bypass circuit connected between said output terminal of said differential stage and said second power supply terminal; and
a level detecting circuit wherein said level detecting circuit generates an output signal when an output level of said output stage has reached a predetermined value and said bypass circuit comprises a constant current source and a switching circuit closed in accordance with said output signal of said level detecting circuit, a predetermined constant current flowing through said bypass circuit when said switching circuit is closed.

4. A comparator circuit for comparing an input voltage with a reference voltage, comprising:
first and second power supply terminals;
a differential stage connected between said first and second power supply terminals, having a first input terminal receiving said reference voltage, a second input terminal receiving said input voltage and an output terminal outputting an output voltage based on said input and reference voltages, comprising:
a first transistor having a source, a gate and a drain, the gate of said first transistor being connected to said second input terminal;
a second transistor having a drain connected to said output terminal, a source connected to the source of said first transistor and a gate connected to said first input terminal;
a third transistor having a source connected to said first power supply terminal and a gate and a drain connected to the drain of said first transistor;
a fourth transistor having a source connected to said first power supply terminal, a drain connected to said output terminal and a gate connected to the gate of said third transistor; and
a constant current source connected to the source of said first and second transistor and to said second power supply terminal;
an output stage connected to the output terminal of said differential stage;
a first bypass circuit, having a first constant current source, connected to the output terminal of said differential stage and to said second power supply terminal; and
a second bypass circuit, having a second constant current source, connected to the drain of said first transistor and to said second power supply terminal, said first and second bypass circuits supplying a constant predetermined current to limit the output voltage of said differential stage to a predetermined value.

5. A comparator circuit for comparing an input voltage with a reference voltage, comprising:
first and second power supply terminals;
a differential stage connected between said first and second power supply terminals, having a first input terminal receiving said first reference voltage, a second input terminal receiving said input voltage and an output terminal outputting an output voltage based on said input and reference voltages, comprising:
a first transistor having a source, a gate and a drain, the gate of said first transistor being connected to said second input terminal;
a second transistor having a drain connected to said output terminal, a source connected to the source of said first transistor and a gate connected to said first input terminal;
a third transistor having a source connected to said first power supply terminal and a gate and drain connected to the drain of said first transistor;
a fourth transistor having a source connected to said first power supply terminal, a drain connected to said output terminal and a gate connected to the gate of said third transistor; and
a constant current source connected to the source of said first and second transistor and to said second power supply terminal;
an output stage connected to the output terminal of said differential stage;
a bypass circuit comprising a constant current source and a switching circuit, having closeable contacts, connected in series between the output terminal of said differential stage and said second power supply terminal; and
a level detection circuit generating a switching signal when an output level of said output reaches a predetermined value, closing the contacts of said switching circuit, said bypass circuit supplying a constant predetermined current to limit the output voltage of said differential stage to a predetermined value when said contacts of said switching circuit are closed.

* * * * *

UNITED STATES PATENT AND TRADEMARK OFFICE
CERTIFICATE OF CORRECTION

PATENT NO. : 4,835,417
DATED : May 30, 1989
INVENTOR(S) : Kousaka et al.

It is certified that error appears in the above-identified patent and that said Letters Patent is hereby corrected as shown below:

- Col. 10, line 6, delete "first".

Signed and Sealed this

Thirtieth Day of January, 1990

Attest:

JEFFREY M. SAMUELS

Attesting Officer     Acting Commissioner of Patents and Trademarks